United States Patent
Xu et al.

(10) Patent No.: US 11,360,611 B2
(45) Date of Patent: Jun. 14, 2022

(54) FLEXIBLE TOUCH SUBSTRATE, PREPARATION METHOD THEREOF AND TOUCH DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Zhanqi Xu, Beijing (CN); Ming Zhang, Beijing (CN); Yanping Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 605 days.

(21) Appl. No.: 16/307,742

(22) PCT Filed: Mar. 21, 2018

(86) PCT No.: PCT/CN2018/079807
§ 371 (c)(1),
(2) Date: Dec. 6, 2018

(87) PCT Pub. No.: WO2019/007106
PCT Pub. Date: Jan. 10, 2019

(65) Prior Publication Data
US 2021/0223883 A1    Jul. 22, 2021

(30) Foreign Application Priority Data
Jul. 5, 2017  (CN) .......................... 201710544165.9

(51) Int. Cl.
*G06F 3/044* (2006.01)
*H01L 27/01* (2006.01)

(52) U.S. Cl.
CPC ............ *G06F 3/044* (2013.01); *H01L 27/016* (2013.01); *G06F 2203/04102* (2013.01); *G06F 2203/04107* (2013.01)

(58) Field of Classification Search
CPC ........... G06F 3/044; G06F 2203/04102; G06F 3/04107; H01L 27/01; H01L 27/016
See application file for complete search history.

(56) References Cited

U.S. PATENT DOCUMENTS

| 2014/0218630 A1* | 8/2014 | Kang | ..................... G06F 3/0446 349/12 |
| 2015/0062467 A1* | 3/2015 | Kang | ..................... G06F 3/0446 349/12 |

(Continued)

FOREIGN PATENT DOCUMENTS

| CN | 103455203 A | 12/2013 |
| CN | 203480463 U | 3/2014 |

(Continued)

OTHER PUBLICATIONS

China Second Office Action, Application No. 201710544165.9, dated Oct. 22, 2019, 23 pps.: with English translation.

(Continued)

*Primary Examiner* — Hong Zhou
(74) *Attorney, Agent, or Firm* — Armstrong Teasdale LLP

(57) ABSTRACT

The embodiments of the present disclosure provide a flexible touch substrate and a method for fabricating the same, and a touch display device and relate to touch control technology. Deformation or crack of the touch electrode pattern when the flexible touch substrate is bent, and can realize large curvature bending. The flexible touch substrate includes a flexible base substrate, touch electrode patterns (Continued)

disposed on a first surface of the flexible base substrate, and at least one groove on at least one of the first surface and a second surface opposite the first surface of the flexible base substrate, wherein a projection of the groove on the base substrate is within a projection of a gap between the touch electrode patterns on the base substrate.

16 Claims, 8 Drawing Sheets

(56) References Cited

U.S. PATENT DOCUMENTS

| | | | |
|---|---|---|---|
| 2016/0202831 A1* | 7/2016 | Kim | G06F 3/0443 |
| | | | 345/173 |
| 2016/0320803 A1 | 11/2016 | Oh et al. | |
| 2017/0031484 A1* | 2/2017 | Kim | G06F 3/0443 |
| 2017/0031486 A1* | 2/2017 | Li | G06F 3/0412 |
| 2017/0115818 A1* | 4/2017 | Cai | G06F 3/0446 |
| 2017/0308196 A1* | 10/2017 | Jeong | H01L 51/5253 |
| 2018/0366685 A1* | 12/2018 | Park | G06F 3/044 |
| 2019/0013493 A1* | 1/2019 | Sonoda | H01L 51/524 |

FOREIGN PATENT DOCUMENTS

| | | |
|---|---|---|
| CN | 106129082 A | 11/2016 |
| CN | 106227380 A | 12/2016 |
| CN | 106354314 A | 1/2017 |
| CN | 107315507 A | 11/2017 |
| JP | 2016091948 A | 5/2016 |

OTHER PUBLICATIONS

PCT International Search Report, Application No. PCT/CN2018/079807, dated Jun. 21, 2018, 5 pages: with English translation.
PCT Written Opinion, Application No. PCT/CN2018/079807, dated Jun. 21, 2018, 5 pages.: with English translation of relevant part.
China First Office Action, Application No. 201710544165.9, dated Mar. 4, 2019, 28 pps.: with English translation.
European Extended Search Report, Application No. 18807844.8, dated Feb. 24, 2021, 9 pps.
European First Office Action, Application No. 18807844.8, dated Apr. 28, 2022, 9 pps.

* cited by examiner

FLEXIBLE TOUCH SUBSTRATE, PREPARATION METHOD THEREOF AND TOUCH DISPLAY DEVICE

CROSS REFERENCE TO RELATED APPLICATIONS

This patent application is a National Stage Entry of PCT/CN2018/079807 filed on Mar. 21, 2018, which claims the benefit and priority of Chinese Patent Application No. 201710544165.9 filed on Jul. 5, 2017, the disclosures of which are incorporated herein by reference in their entirety as part of the present application.

BACKGROUND

The present disclosure relates to a field of touch technologies, more particular, to a flexible touch substrate, a method for fabricating the same, and a touch display device.

At present, more and more electronic products with touch functions are widely used in people's daily life and work. With the continuous development of technology, people's requirements for various aspects of electronic products are also increasing. For example, electronic products are required to be freely bent and folded, and flexible touch display devices are produced under such a general trend. A flexible touch display device, as the name implies, is a touch display device capable of bending. The flexible touch display device can realize bending with less curvature than a general touch display device.

BRIEF DESCRIPTION

Some embodiments of the present disclosure adopt the following technical solutions:

A first aspect of the present disclosure provides a flexible touch substrate including a flexible base substrate, touch electrode patterns disposed on a first surface of the flexible base substrate, and at least one groove on at least one of the first surface and a second surface opposite the first surface of the flexible base substrate. A projection of the groove on the base substrate is within a projection of a gap between the touch electrode patterns on the base substrate.

The groove may have a depth of about 5 μm to 10 μm.

The groove may be strip-shaped and an extending direction of the groove may be parallel to an extending direction of a bending axis of the flexible base substrate.

The touch electrode patterns may include plural columns of first touch electrodes and plural rows of second touch electrodes, wherein the second touch electrodes and the first touch electrodes may intersect and may be insulated from each other.

The second touch electrode may include plural second sub-touch electrodes and a bridge. Wherein the second sub-touch electrodes may be spaced apart from one another by the first touch electrodes and the bridge may connect second sub-touch electrodes adjacent in a row direction and may be insulated from the first touch electrode.

The flexible touch substrate may further include an insulating pattern between the second sub-touch electrodes adjacent in the row direction and may cover the first touch electrode, wherein the bridge may be located on the insulating pattern.

The flexible touch substrate may further include a bridge between the second sub-electrodes adjacent in the row direction and an insulating pattern on the bridge, wherein the first touch electrodes may be located on the insulating pattern.

The flexible touch substrate may further include a protective layer disposed on a side of the touch electrode pattern away from the flexible base substrate.

The flexible touch substrate may further include a protective film disposed on a side of the protective layer away from the touch electrode patterns.

A second aspect of the present disclosure provides a touch display device including the above flexible touch substrate.

A third aspect of embodiments of the present disclosure provides a method for fabricating a flexible touch substrate. The method includes forming touch electrode patterns on a first surface of a flexible base substrate, and forming at least one groove on at least one of the first surface and a second surface opposite the first surface of the flexible base substrate, wherein a projection of the groove on the base substrate is within a projection of a gap between the touch electrode patterns on the base substrate.

The touch electrode patterns may include plural columns of first touch electrodes and plural rows of second touch electrodes, and wherein the second touch electrodes may include plural second sub-touch electrodes spaced apart from one another by the first touch electrodes. After forming the groove on the flexible base substrate, the method may further include forming an insulating film on the touch electrode pattern, patterning the insulating film to form an insulating pattern between the second sub-touch electrodes adjacent in the row direction and covering the first touch electrode, forming a conductive film on the insulating pattern, and patterning the conductive film to form a bridge connecting the second sub-touch electrodes adjacent in the row direction.

The touch electrode pattern may include plural columns of first touch electrodes and plural rows of second touch electrodes, wherein the second touch electrodes may include plural second sub-touch electrodes spaced apart from one another by the first touch electrodes. Before forming the touch electrode pattern on the flexible base substrate, the method may further include forming a conductive film, patterning the conductive film to form a bridge for connecting second sub-touch electrodes, to be formed, adjacent in a row direction, forming an insulating film on the bridge, and patterning the insulating film to form an insulating pattern.

After forming the touch electrode patterns, the insulating pattern and the bridge, the method may further include forming a protective layer.

After forming the protective layer, the method may further include attaching a protective film on the protective layer.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1A:
FIG. 1A is a schematic structural view of a flexible touch substrate being not bent.

The technical solutions in the embodiments of the present disclosure will be more clearly and more completely described in conjunction with the drawings in the embodiments of the present disclosure. It is obvious that the described embodiments are only a part of the embodiments of the present disclosure, and not all of the embodiments. All other embodiments obtained by a person of ordinary skill in the art based on the embodiments of the present disclosure without departing from the inventive scope are in the scope of the disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on", or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating, or semiconductor layers at the interface of the two elements.

Figure 1B:
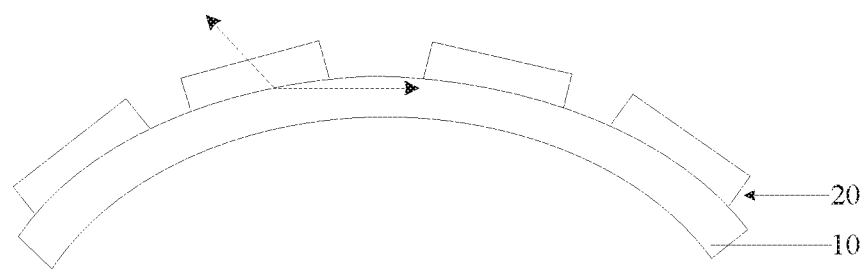
FIG. 1B is a schematic structural view of a flexible touch substrate being bent.

As shown in FIG. 1A, a flexible touch substrate in a flexible touch product is a touch electrode pattern 20 prepared on a flexible base substrate 10, therefore only a bending with a small curvature can be achieved. When bending with a large curvature, as shown in FIG. 1B, the flexible base substrate 10 generates a large stress. The stress concentrates on the contact surfaces of the flexible substrate 10 and the touch electrode pattern 20. Since the stress of the flexible base substrate 10 does not match that of the touch electrode pattern 20, if the large stress cannot be released, the touch electrode pattern 20 on the flexible substrate 10 is easily deformed or cracked. Thus, the touch sensitivity will be reduced or even the touch failure will occur, which greatly affects the reliability of the flexible touch products.

The embodiments of the present disclosure provide a flexible touch substrate. as shown in FIGS. 2A to 2D, The flexible touch substrate includes a flexible substrate 10 and touch electrode patterns 20 disposed on a first surface of the flexible base substrate 10, at least one groove 101 is provided on a surface of the flexible base substrate 10 that is perpendicular to a thickness direction thereof (i.e., at least one of the first surface and the second surface opposite to the first surface). A projection of the groove 101 on the base substrate is within a projection of a gap between the touch electrode patterns 20 on the base substrate. The flexible touch substrate provided by the embodiments of the disclosure can prevent the touch electrode pattern from being deformed or cracked when the flexible touch substrate is bent, and can realize large curvature bending. Since the flexible substrate is provided with at least one groove, when the flexible touch substrate is bent, on the one hand, the groove can release the stress generated by the bending, on the other hand, the stress caused by the bending of the flexible substrate is focusing on the bottom of the groove and the stress direction of the flexible substrate is consistent with the stress direction of the touch electrode pattern, therefore the touch electrode pattern can be prevented from being deformed or cracked. Based on this, the flexible touch substrate can achieve large curvature bending, and when being bent, the touch electrode pattern can be prevented from being deformed or cracked. Therefore, the reliability of the flexible touch substrate is improved.

It should be noted that, first, the material of the flexible base substrate 10 is not limited. For example, the material of the flexible base substrate 10 may be PET (Polyethylene terephthalate) or COP (Cyclo-olefin polymer) etc.

Second, when the flexible touch substrate is used for display, the material of the touch electrode pattern 20 is a transparent material. For example, the material of the touch electrode pattern 20 may be, for example, at least one of ITO (Indium Tin Oxide) or IZO (Indium Zinc Oxide).

Third, there are two surfaces perpendicular to the thickness direction of the flexible substrate 10. One is a surface on which the touch electrode pattern 20 is formed (i.e., the first surface), and the other is a surface (i.e., the second surface) opposite to the surface on which the electrode pattern 20 is formed.

Figure 2A:
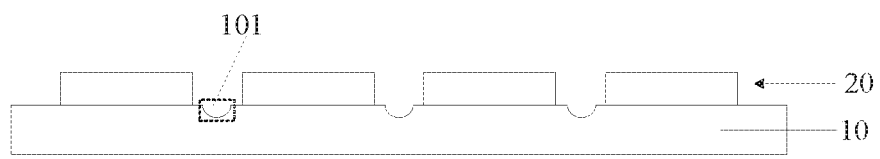
FIG. 2A is a first schematic structural view of a flexible touch substrate according to at least one embodiment of the present disclosure.
Figure 2B:
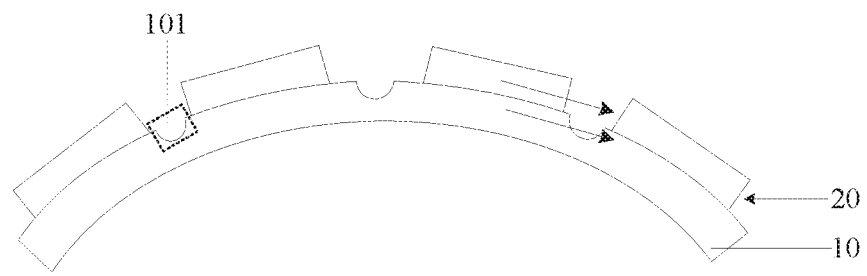
FIG. 2B is a schematic structural view of a flexible touch substrate when it is bent according to at least one embodiment of the present disclosure.
Figure 2C:
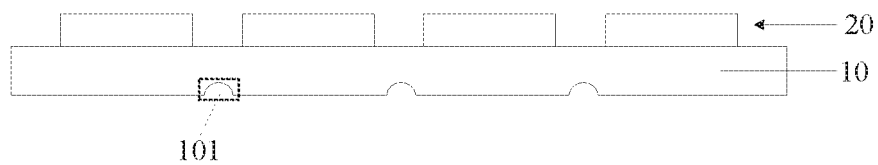
FIG. 2C is a second schematic structural view of a flexible touch substrate according to at least one embodiment of the present disclosure.
Figure 2D:
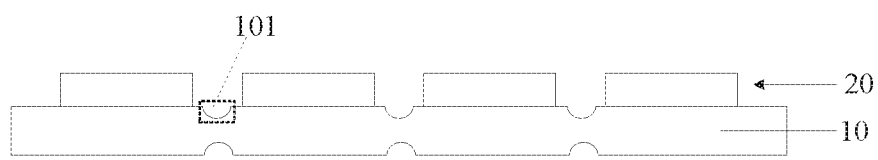
FIG. 2D is a third schematic structural view of a flexible touch substrate according to at least one embodiment of the present disclosure.

Based on this, as shown in FIG. 2A, the groove 101 may be disposed on the surface of the flexible substrate 10 where the touch electrode pattern 20 is formed, or may be disposed, as shown in FIG. 2C, on the surface of the flexible substrate 10 opposite to the surface on which the touch electrode pattern 20 is formed (that is, on the side of the flexible substrate away from the touch electrode pattern), of course, it may be as shown in FIG. 2D, both surfaces of the flexible substrate 10 perpendicular to the thickness direction thereof are provided with grooves.

On the basis of this, the number of the grooves 101 provided on the flexible base substrate 10 and the depth of the groove 101 are not limited, and may be appropriately set as needed. In some embodiments of the present disclosure, the grooves 101 may be evenly distributed in the gap between the touch electrode patterns 20.

Referring to FIG. 2A and FIG. 2B, when the flexible touch substrate is bent, the stress direction of the flexible substrate 10 is consistent with the stress direction of the touch electrode pattern 20, and the groove 101 can release the stress (tension and compressive stress) generated by the bending in the flexible substrate 10. Thus, the touch electrode pattern 20 does not break, and the flexible touch substrate can achieve bending with a large curvature.

The embodiments of the present disclosure provide a flexible touch substrate. Since the flexible substrate 10 is provided with plural grooves 101, when the flexible touch substrate is bent, on the one hand, the groove 101 can release the stress caused by the bending. On the other hand, the stress generated by the bending of the flexible substrate 10 is concentrated on the bottom of the groove 101, and the stress direction of the flexible substrate 10 is consistent with the direction of the stress received by the touch electrode pattern 20, thereby avoiding the deformation or crack of the touch electrode pattern 20. Based on this, the flexible touch substrate can realize large curvature bending, and when the bending, the touch electrode pattern 20 can be prevented from being deformed or cracked. The reliability of the flexible touch substrate is improved.

Alternatively, as shown in FIGS. 2A and 2B, the groove 101 is located on a surface (i.e., a first surface) of the base substrate 10 on which the touch electrode pattern 20 is formed.

When the groove 101 is formed on the surface on which the touch electrode pattern 20 is formed, the touch electrode pattern 20 and the flexible substrate 10 may be or may not be in direct contact with each other. Other film layers may be disposed between the flexible base substrates 10 and the touch electrode pattern 20. Since the touch electrode pattern 20 is in contact with the surface of the flexible substrate 10 on which the groove 101 is formed, the stress generated by the interface where the touch electrode pattern 20 and the flexible base substrate 10 are in contact can be more effectively released from the groove 101. The touch electrode pattern 20 is further prevented from being cracked, and thus, the touch electrode pattern 20 may be in contact with the surface the flexible base substrate 10 of the present disclosure on which the groove 101 is formed.

Compared with disposing groove 101 on the surface opposite to the side on which the touch electrode pattern 20 is formed, the groove 101 in the embodiments of the present disclosure is disposed on the surface on which the touch electrode pattern 20 is formed, thus the groove 101 is closer to the touch electrode pattern 20. When the flexible touch substrate is bent, the stress generated by the flexible base substrate 10 can be released from the groove 101, so that the touch electrode pattern 20 can be better prevented from being cracked.

It should be noted that the thickness of the flexible base substrate 10 is generally about 100 μm. If the depth of the groove 101 is too large, the flexible substrate may be cracked when the flexible touch substrate is bent; if the depth of the groove 101 is too small, when the flexible touch substrate is bent, the stress released by the groove 101 is small, thus the problem that the touch electrode pattern 20 is cracked cannot be effectively avoided. Based on this, in some embodiments of the present disclosure, the depth of the groove 101 is about 5 μm to about 10 μm.

Figure 3A:
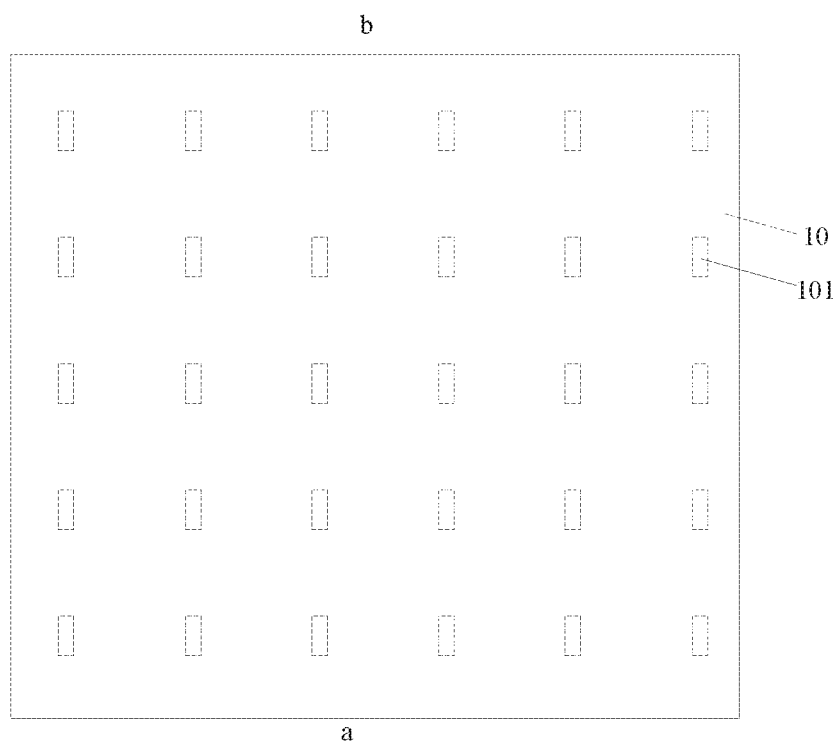
FIG. 3A is a schematic structural view showing grooves formed on a flexible substrate according to at least one embodiment of the present disclosure.
Figure 3B:
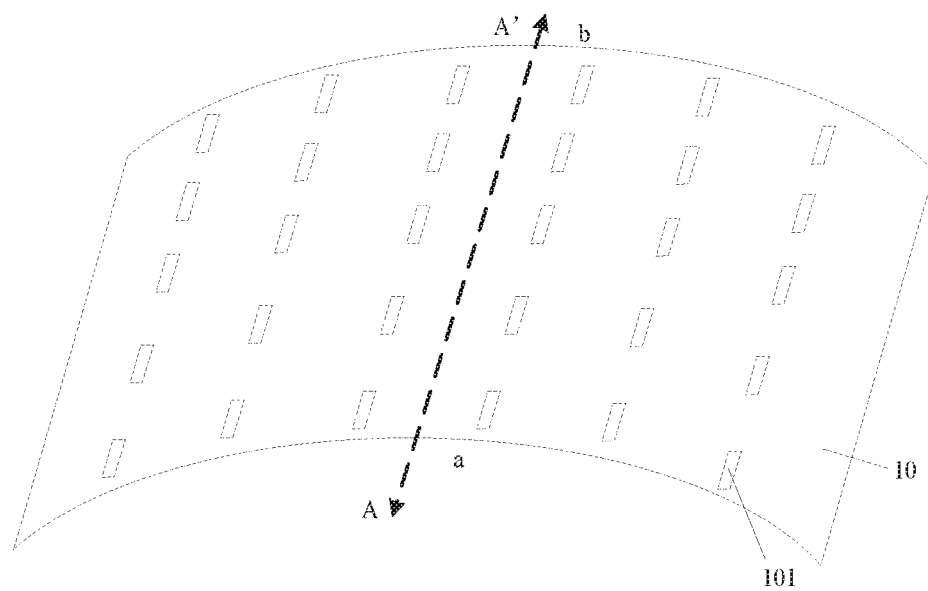
FIG. 3B is a schematic structural view of a flexible substrate when it is bent according to at least one embodiment of the present disclosure.

Since most of the existing flexible touch products are bent in one direction, the stress generated by the bending can be released from the groove 101 as much as possible. The stress direction when the flexible base substrate 10 is bent is same as the stress direction when the touch electrode pattern 20 is bent. Thus, in some embodiments of the present disclosure, as shown in FIGS. 3A and 3B, the groove 101 may be strip-shaped, and the extending direction of the groove 101 may be parallel to the extending direction of the bending axis AA' of the flexible base substrate 10. Referring to FIGS. 3A and 3B, FIG. 3A is a schematic view of the flexible base substrate 10 before being bent, and FIG. 3B is a schematic view after the a side and the b side of the flexible base substrate 10 are bent.

Figure 4:
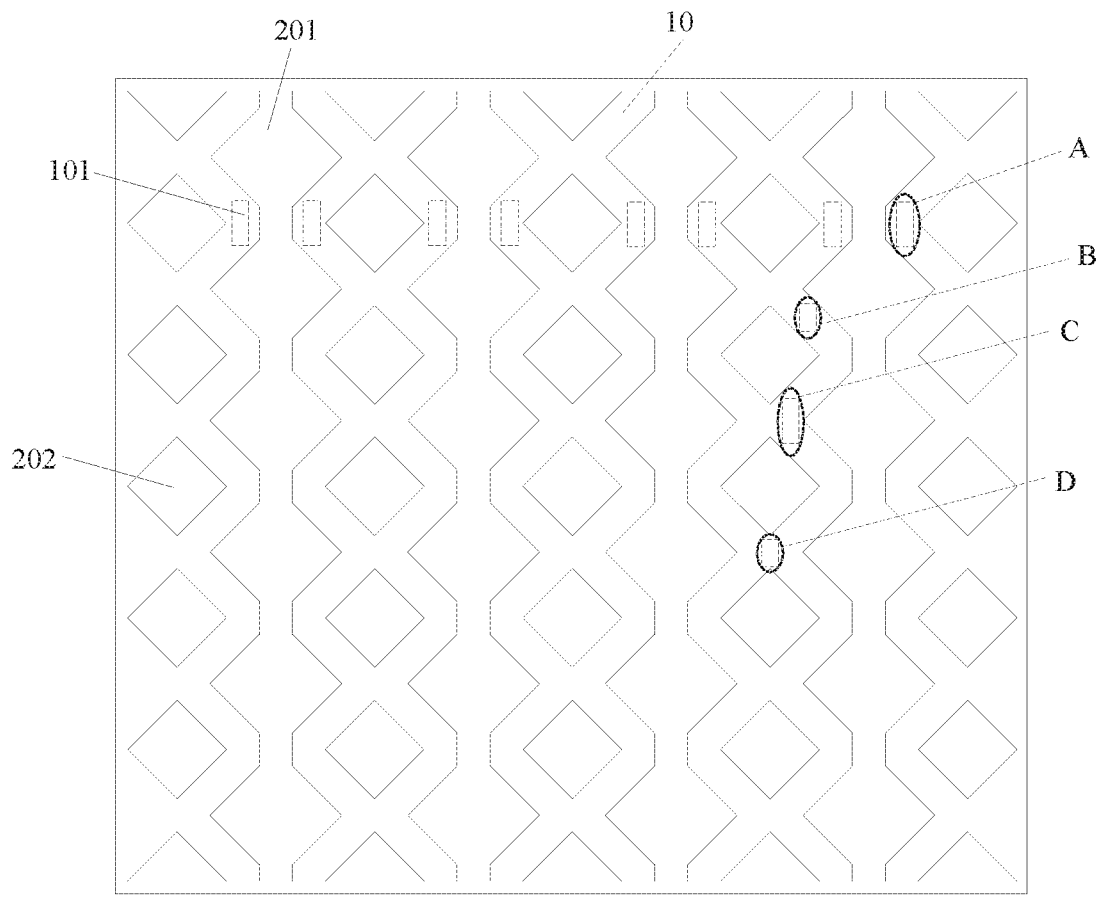
FIG. 4 is a schematic structural view of a touch electrode pattern according to at least one embodiment of the present disclosure.

As shown in FIG. 4, the touch electrode pattern 20 may include plural columns of first touch electrodes 201 and plural rows of second touch electrodes, wherein each row of second touch electrodes may include plural second sub-touch electrodes 202 spaced apart from one another by the first touch electrodes 201.

Based on the above, the projection of the groove 101 on the flexible base substrate 10 is in the projection of the gap between the touch electrode patterns 20 on the base substrate. The specific arrangement position of the groove 101 is not limited. For example, as shown in FIG. 4, grooves are at position A, B, C, or D.

It should be noted that FIG. 4 of the present disclosure only schematically shows several arrangement positions of the grooves 101 (the dotted line frame is the groove 101), and does not show all the grooves on the flexible substrate 10. The grooves 101 of the present disclosure may be evenly distributed on the flexible base substrate 10.

Figure 5:
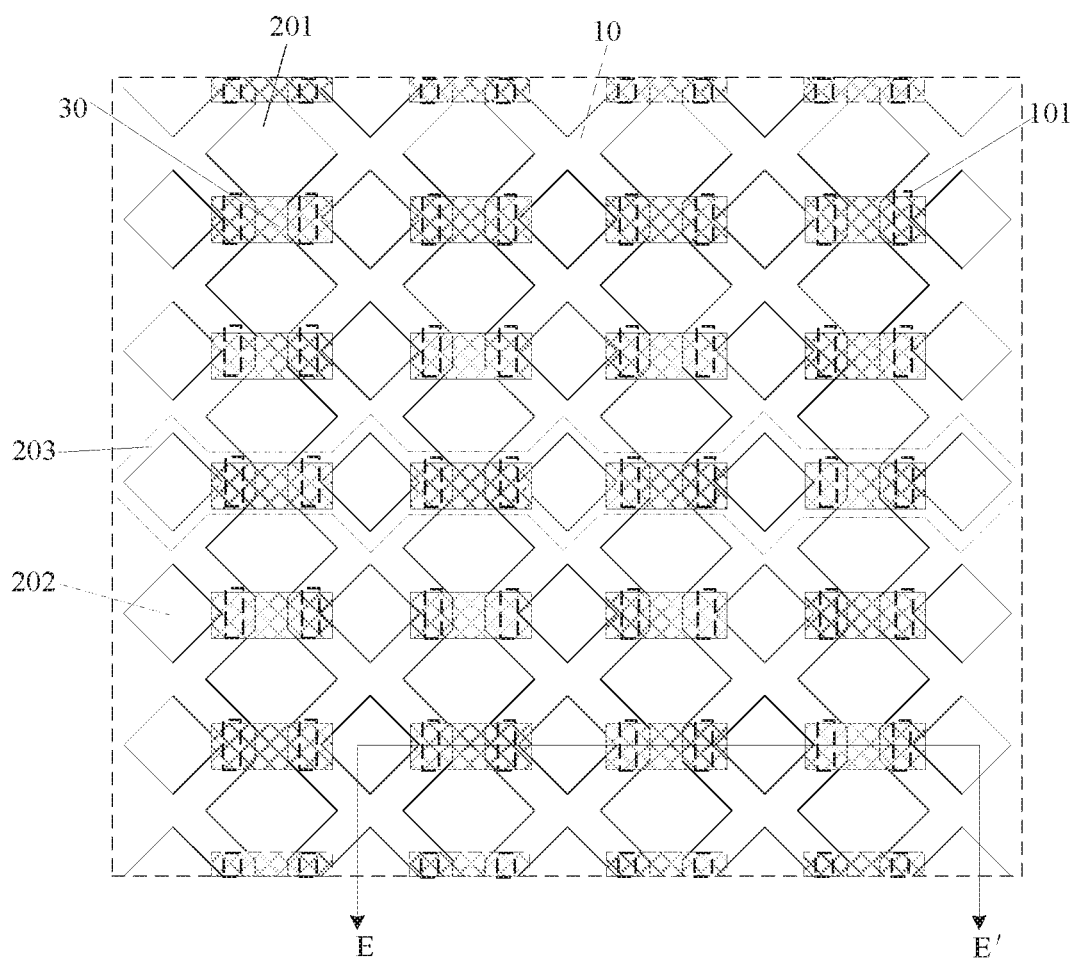
FIG. 5 is a schematic structural view of forming a first touch electrode and a second touch electrode on a flexible substrate according to at least one embodiment of the present disclosure.
Figure 6:
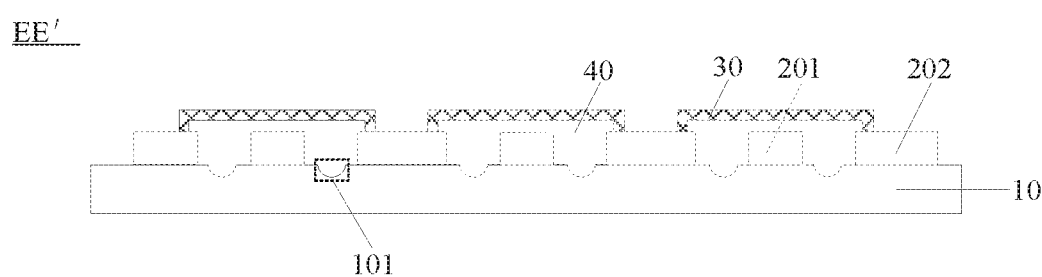
FIG. 6 is a cross-sectional view taken along line EE' of FIG. 5.

As shown in FIG. 5 and FIG. 6, the flexible touch substrate further includes a bridge 30 for connecting the second sub-touch electrodes 202 adjacent in the row direction to form plural parallel second touch electrodes 203. The second touch electrode 203 intersects with the first touch electrode 201 and are insulated from each other.

The material of the bridge 30 is not limited. For example, the material of the bridge 30 may be a metal material or the same material as the touch electrode pattern 20.

Here, as shown in FIG. 6, since the second touch electrode 203 and the first touch electrode 201 intersect and are insulated from each other, an insulating pattern 40 is disposed between the bridge 30 and the first touch electrode 201. The insulating pattern is not shown in FIG. 5. As shown in FIG. 6, the insulating pattern 40 may be located between the two second sub-touch electrodes 202 adjacent in the row direction and cover the first contact electrode 201, wherein the bridge 30 is on the insulating pattern 40.

Figure 15:
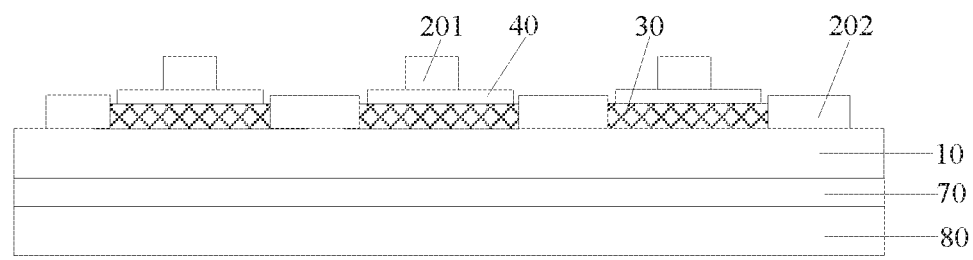
FIG. 15 is a schematic structural view of forming a bridge, an insulating pattern and a touch electrode pattern on a flexible substrate according to at least one embodiment of the present disclosure.

In at least one embodiment, as shown in FIG. 15, the flexible touch substrate may further include a bridge 30 between the two second sub-electrodes 202 adjacent in the row direction and an insulating pattern 40 on the bridge 30. The second touch electrode 201 is located on the insulating pattern 40.

In addition, the first touch electrode 201 may be an induced electrode (Rx), and the second touch electrode 203 may be a driving electrode (Tx). The first touch electrode 201 may be a driving electrode, and the second touch electrode 203 may be induced electrode.

In embodiments of the present disclosure, the touch function can be implemented by the first and second touch electrodes 201 and 203 that intersect with each other and are insulated from each other.

Figure 7:
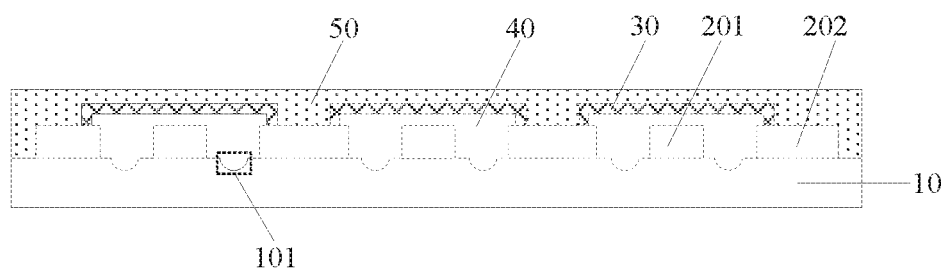
FIG. 7 is a fourth schematic structural view of a flexible touch substrate according to at least one embodiment of the present disclosure.

As shown in FIG. 7, the flexible touch substrate may further include a protective layer (OC) 50 disposed on a side of the touch electrode pattern 20 away from the flexible base substrate 10.

The material of the protective layer 50 is not limited. For example, the material of the protective layer may include at least one of silicon nitride (SiNx), silicon oxide (SiOx), or silicon oxynitride (SiNxOy).

In embodiments of the present disclosure, since the protective layer 50 is disposed on the touch electrode pattern 20, the touch electrode pattern 20 can be prevented from being damaged. There, the touch electrode pattern 20 is protected.

Figure 8A:
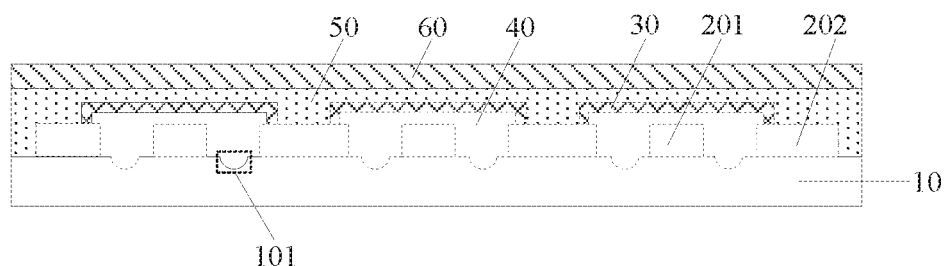
FIG. 8A is a fifth schematic structural view of a flexible touch substrate according to at least one embodiment of the present disclosure.
Figure 8B:
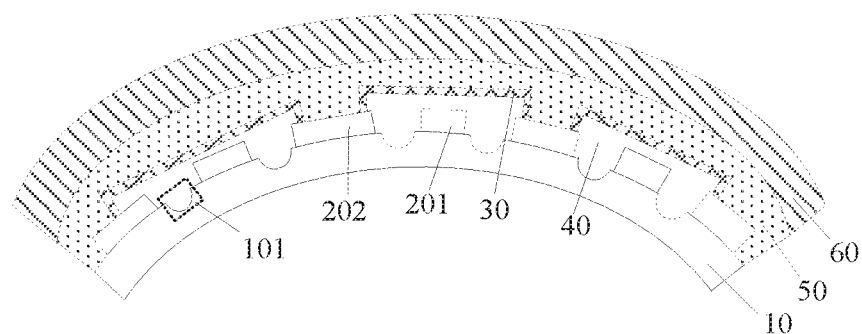
FIG. 8B is a schematic structural view of the flexible touch substrate of FIG. 8A when being bent.

A person skilled in the art should understand that the flexible touch substrate is a mother board and may include plural sub-flexible touch substrates during the fabrication process. After the flexible touch substrate is formed, plural sub-flexible touch substrates are formed by cutting. The flexible touch substrate is easy to be scratched due to the cutting. As shown in FIGS. 8A and 8B, in the embodiments of the present disclosure, the flexible touch substrate may further include a protective film 60 disposed (e.g., attached) on the side of the protective layer 50 that is away from the touch electrode pattern 20.

Herein, the protective film 60 may be attached to the protective layer 50 by an optical clear resin (OCR).

It should be noted that since the protective film 60 is disposed above the protective layer 50 and the protective film 60 is in contact with the external environment, the protective film 60 has a relatively high hardness with respect to the protective layer 50.

In embodiments of the present disclosure, the protective film 60 is attached on the protective layer 50, so that scratches of the flexible touch substrate during transportation or cutting can be further prevented.

Referring to FIG. 8A and FIG. 8B, FIG. 8A is a schematic structural view of a flexible touch substrate that is not bent, and FIG. 8B is a schematic structural view of the flexible touch substrate when being bent. When the flexible touch substrate is bent, the stress generated by the flexible substrate 10 can be released through the groove 101 in the flexible substrate 10, so that the touch electrode pattern 20 can be prevented from being deformed or cracked.

Figure 18:
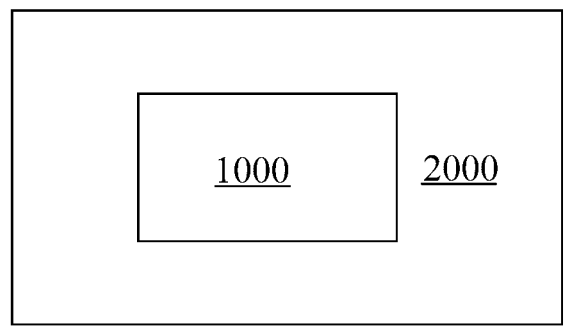
FIG. 18 is a block diagram showing example embodiments of a touch display device.

Embodiments of the present disclosure provide a touch display device including the above flexible touch substrate. FIG. 18 is a block diagram showing example embodiments of a touch display device. As shown in FIG. 18, the touch display device 2000 includes a flexible touch substrate 1000. In these example embodiments, the flexible touch substrate 1000 is a substrate 1000 as shown in FIGS. 2A, 2B, 2C, 2D, 3A, 3B, 7, 8A, and 8B.

The touch display device provided by the embodiments of the present disclosure may be any device that displays an image regardless of motion (e.g., video) or being fixed (e.g., still image) and whether text or picture. More specifically, it is contemplated that the described embodiments can be implemented in or associated with a variety of electronic devices such as, but not limited to, mobile phones, wireless devices, personal data assistants (PDAs), handheld or portable computer, GPS receiver/navigator, camera, MP4 video player, video camera, game console, watch, clock, calculator, TV monitor, flat panel display, computer monitor, car monitor (for example, Odometer display, etc.), navigator, cockpit controller and/or display, camera view display (e.g., rear view camera display in vehicle), electronic photo, electronic billboard or signage, projector, building structure, packaging and the aesthetic structure (for example, a display for an image of a piece of jewelry), etc. In addition, the touch display device may also be a touch display panel.

The embodiments of the present disclosure provide a touch display device including a flexible touch substrate. Since the flexible substrate 10 includes at least one groove 101, when the flexible touch substrate is bent, on the one hand, the groove 101 can release the stress generated by the bending; on the other hand, the stress generated by the bending of the flexible base substrate 10 is concentrated on the bottom of the groove 101, and the direction of stress of the flexible base substrate 10 is consistent with the direction of the stress received by the touch electrode pattern 20 this time, so that the touch electrode pattern 20 can be prevented from being deformed or cracked. Based on this, the touch display device can realize large curvature bending. When being bent, the touch electrode pattern 20 can be prevented from being deformed or cracked, and the reliability of the touch display device is improved.

Figure 9:
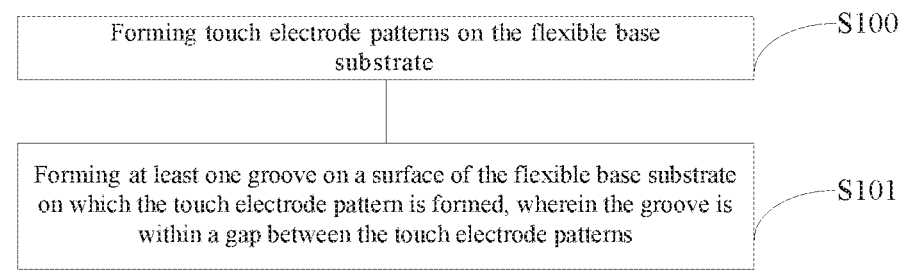
FIG. 9 is a schematic flow chart of a method for fabricating a flexible touch substrate according to at least one embodiment of the present disclosure.
Figure 10:
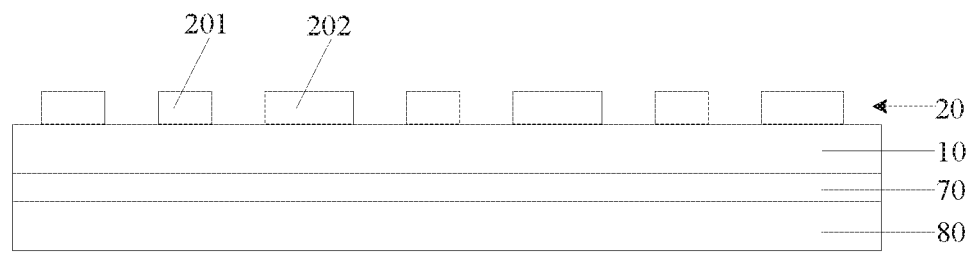
FIG. 10 is a schematic structural view of forming a touch electrode pattern on a flexible substrate according to at least one embodiment of the present disclosure.

The embodiments of the present disclosure further provide a method for preparing a flexible touch substrate. As shown in FIG. 9, the method includes:

S100, as shown in FIG. 10, forming a touch electrode pattern 20 on the first surface of the flexible substrate 10.

The material of the flexible base substrate 10 is not limited. For example, the material of the flexible base substrate may be PET or COP.

Here, when the flexible touch substrate is used for display, the material of the touch electrode pattern 20 may be a transparent material. For example, the material of the touch electrode pattern 20 may be at least one of ITO or IZO.

On the basis of this, the preparation process of the touch electrode pattern 20 is not limited. For example, the touch electrode pattern 20 can be prepared by a yellow light process. Specifically, a conductive film is deposited first, and then photoresist is coated. Next, photolithography development and etching process are applied to form a touch electrode pattern 20.

Figure 11:
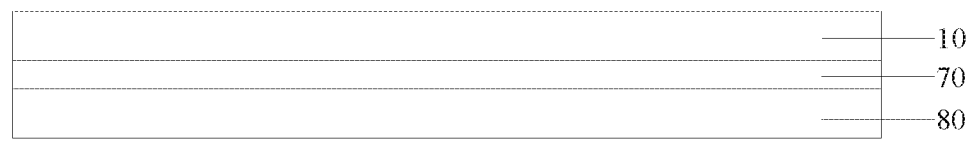
FIG. 11 is a schematic structural view of attaching a flexible substrate to a carrier substrate according to at least one embodiment of the present disclosure.

It should be noted that since the flexible substrate 10 is soft and easy to bend, it may not be easy to form the touch electrode pattern 20 on the flexible base substrate 10. Based on this, before the step S100, the preparation method further includes, as shown in FIG. 11, attaching the flexible base substrate 10 to the carrier substrate 80 through an optically transparent adhesive 70.

The hardness of the carrier substrate 80 is greater than the hardness of the flexible base substrate 10. The carrier substrate 80 can be, for example, glass.

Figure 12:
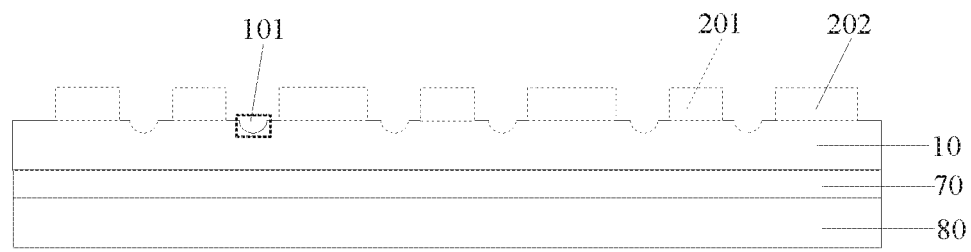
FIG. 12 is a schematic structural view of forming grooves on a flexible substrate formed with a touch electrode pattern according to at least one embodiment of the present disclosure.

S101, as shown in FIG. 12, forming at least one groove 101 on a side surface (i.e., a first surface) of the flexible base substrate 10 on which the touch electrode pattern 20 is formed, wherein a projection of the groove 101 on the base substrate is within a projection of a gap between the touch electrode patterns 20 on the base substrate. It should be noted that although the groove is disposed on the first surface of the flexible base substrate in FIG. 12, the groove may be disposed on the second surface opposite to the first surface of the flexible substrate, if needed. It is also possible to arrange the grooves on both the first surface and the second surface of the flexible substrate.

The groove 101 may be formed on a surface of the flexible substrate 10 on which the touch electrode pattern 20 is formed by a dry etching process such as a laser etching process.

Here, the number of the grooves 101 in the flexible base substrate 10 is not limited, and may be set as needed. In embodiments of the present disclosure, and the grooves 101 may be evenly distributed in the gap between the touch electrode patterns 20. On the basis of this, the depth of the formed groove 101 is not limited. In embodiments of the present disclosure, the depth of the groove 101 may be about 5 μm-10 μm.

In addition, since most of the existing flexible touch products are bent in one direction, to release the stress generated by the bending in the groove 101 as much as possible and keep the direction of stress on the flexible substrate 10 when bent is consist with the direction of the stress on the touch electrode pattern 20 when bent, as shown in FIGS. 3A and 3B, in the embodiments of the present disclosure, the groove 101 may be strip-shaped and the extending direction of the groove 101 may be parallel to the extending direction of the bending axis AA' of the flexible base substrate 10.

The embodiments of the present disclosure provide a method for manufacturing a flexible touch substrate. Since the flexible substrate 10 includes plural grooves 101, when the flexible touch substrate is bent, on the one hand, the stress generated by the bending can be released by the grooves 101. On the other hand, the stress generated by the bending of the flexible base substrate 10 is concentrated on the bottom of the grooves 101, and the direction of stress of the flexible base substrate 10 is consistent with the direction of the stress received by the touch electrode pattern 20. Thus, the touch electrode pattern 20 can be prevented from being deformed or cracked. Based on this, the flexible touch substrate can realize large curvature bending. When being bent, the touch electrode pattern 20 can be prevented from being deformed or cracked, and the reliability of the flexible touch substrate is improved.

Figure 13:
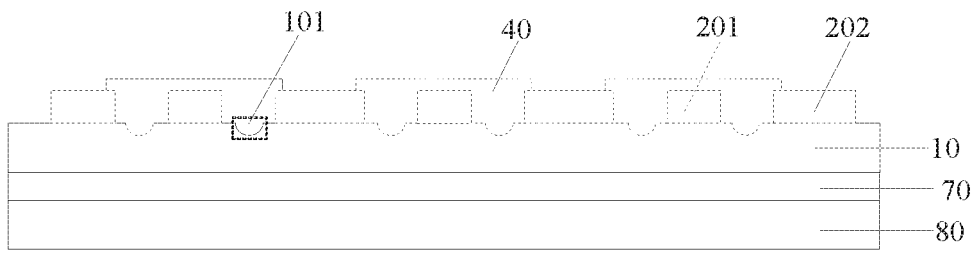
FIG. 13 is a schematic structural view of forming an insulating pattern on a touch electrode pattern according to at least one embodiment of the present disclosure.
Figure 14:
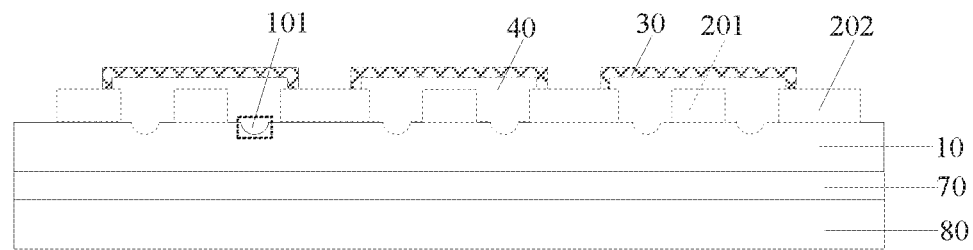
FIG. 14 is a schematic structural view of forming a bridge on an insulating pattern according to at least one embodiment of the present disclosure.

As shown in FIG. 4, the touch electrode pattern 20 may include plural columns of first touch electrodes 201 and plural rows of second touch electrodes. The second touch electrode includes a plurality of second sub-touch electrodes 202 spaced apart by the first touch electrodes 201. After the step S101, the method further includes, as shown in FIG. 13, forming an insulating film and patterning the insulating film to form an insulating pattern 40 between second sub-touch electrodes 202 adjacent in the row direction and covering the first touch electrode 201, as shown in FIG. 14, forming a conductive film and patterning the conductive film to form a bridge 30 connecting the second sub-touch electrodes 202 adjacent in the row direction, and the bridge 30 is used for connecting the second sub-touch electrodes 202 adjacent in the row direction to form the second touch electrode 203.

The material of the insulating pattern 40 is not limited. For example, the material of the insulating pattern may be at least one of silicon nitride, silicon oxide, or silicon oxynitride. On this basis, the insulating pattern 40 may be prepared by a yellow light process. Specifically, the insulating pattern 40 may be formed by applying a photoresist, exposure, development, and etching process.

Here, the material of the bridge 30 is not limited. For example, the material of the bridge may be a metal material or the same material as that of the touch electrode pattern 20. If the material of the bridge 30 is a metal material, the bridge 30 may be formed simultaneously with a metal trace on the flexible touch substrate.

In the embodiments of the present disclosure, the touch function can be implemented by the first touch electrode 201 and the second touch electrode 203.

As shown in FIG. 4, the touch electrode pattern 20 may include plural columns of first touch electrodes 201 and plural rows of second touch electrodes, the second touch electrode includes a plurality of second sub-touch electrodes 202 spaced apart by the first touch electrodes 201. As shown in FIG. 15, before the step S100, the method further includes forming a conductive film, and patterning the conductive film to form the bridge 30. The bridge 30 is used for connecting the second sub-touch electrodes 202 to be formed adjacent in the row direction, forming an insulating film and patterning the insulating film to form an insulating pattern 40 on the bridge 30. The insulating pattern 40 is used to insulate the second sub-touch electrode 202 to be formed from the first electrode 201.

It should be noted that the bridge 30 and the insulating pattern 40 are formed first, and then the touch electrode pattern 20 is formed. After the touch electrode pattern 20 is formed, when the groove 101 is formed on the flexible base substrate 10, since the bridge 30 and the insulating pattern 40 blocks the gap between the partial touch electrode patterns 20, the grooves 101 cannot be formed in the region of the flexible base substrate 10 that is blocked by the bridge 30 and the insulating pattern 40. Referring to FIG. 4, the groove 101 cannot be provided at the position A, but can be provided at the position B, the position C, and the position D.

In the embodiments of the present disclosure, the bridge 30 and the insulating pattern 40 may be formed first, and then the touch electrode pattern 20 is formed. The bridge 30 connects the second sub-touch electrodes of the adjacent rows of the touch electrode patterns 20. Thereby a touch electrode 201 and a second touch electrode 203 can implement a touch function.

Figure 16:
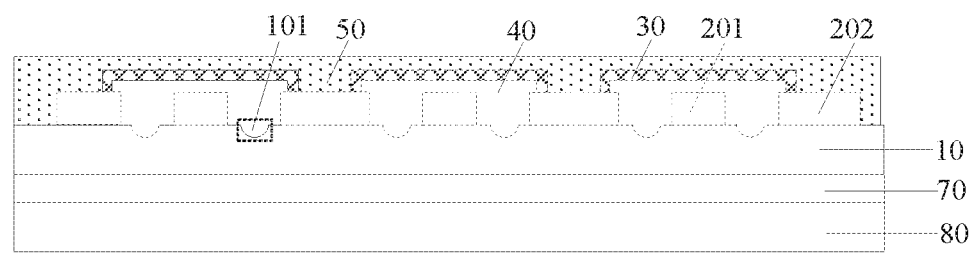
FIG. 16 is a schematic structural view of forming a protective layer on the bridge according to at least one embodiment of the present disclosure.

As shown in FIG. 16, after the touch electrode pattern 20, the insulating pattern 40 and the bridge 30 are formed, the method may further include forming a protective layer 50.

The protective layer 50 may be formed by a yellow light process. Specifically, a protective layer film is first formed, and then a photoresist is coated, later the protective layer 50 is formed by an exposure, development, and etching process.

Here, the material of the protective layer 50 is not limited. For example, the material of the protective layer 50 may be at least one of silicon nitride, silicon oxide, or silicon oxynitride.

In the embodiments of the present disclosure, the protective layer 50 is formed on the touch electrode pattern 20. Therefore, the touch electrode pattern 20 can be prevented from being damaged. Thus, the touch electrode pattern 20 is protected.

Figure 17:
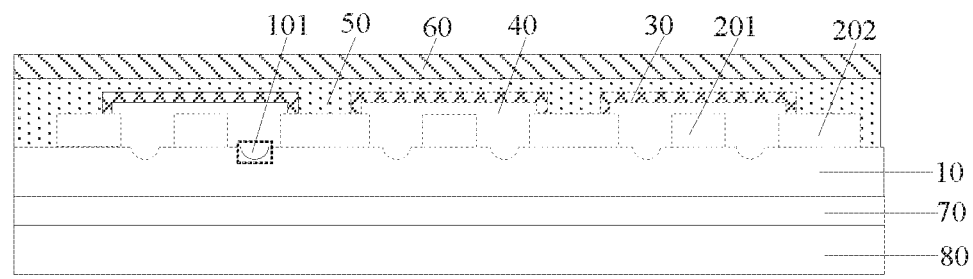
FIG. 17 is a schematic structural view of attaching a protective film on a protective layer according to at least one embodiment of the present disclosure.

Further, as shown in FIG. 17, after the protective layer 50 is formed, the method further includes attaching a protective film 60 on the protective layer 50.

Here, the protective film 60 may be attached to the protective layer 50 using a photoresist.

It should be noted that since the protective film 60 is disposed above the protective layer 50 and the protective film 60 is in contact with the external environment, the protective film 60 has a relatively high hardness with respect to the protective layer 50.

In the embodiments of the present disclosure, the protective film 60 is attached on the protective layer 50, so that scratches to the flexible touch substrate during transportation or cutting can be prevented.

Based on the above, after the layers on the flexible touch substrate are all prepared, the flexible base substrate 10 can be peeled off from the carrier substrate 80 to obtain a flexible touch substrate as shown in FIG. 8A.

Having described certain specific embodiments, these embodiments have been presented by way of example only, and are not intended to limit the scope of the present disclosure. Indeed, the novel embodiments described herein may be embodied in various other forms; forms, furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A flexible touch substrate comprising:
    a flexible base substrate;
    touch electrode patterns disposed on a first surface of the flexible base substrate, wherein the touch electrode patterns comprise plural columns of first touch electrodes and plural rows of second touch electrodes, wherein the second touch electrodes and the first touch electrodes intersect and are insulated from each other, wherein the second touch electrodes comprise plural second sub-touch electrodes and a bridge, wherein the second sub-touch electrodes are spaced apart from one another by the first touch electrodes, wherein the bridge connects the second sub-touch electrodes adjacent in a row direction and is insulated from the first touch electrodes; and
    at least one groove at least disposed on a second surface opposite the first surface of the flexible base substrate, wherein a projection of the groove on the base substrate is within a projection of a gap between the touch electrode patterns on the base substrate, and wherein the groove is located at a position of the base substrate that does not overlap with the bridge in a direction perpendicular to the first surface.

2. The flexible touch substrate according to claim 1, wherein the groove has a depth of about 5 μm to about 10 μm.

3. A touch display device comprising the flexible touch substrate according to claim 2.

4. The flexible touch substrate according to claim 1, wherein the groove is strip-shaped, and wherein an extending direction of the groove is parallel to an extending direction of a bending axis of the flexible base substrate.

5. A touch display device comprising the flexible touch substrate according to claim 4.

6. The flexible touch substrate according to claim 1, wherein the flexible touch substrate further comprises an insulating pattern between the second sub-touch electrodes adjacent in the row direction and covering the first touch electrodes, and wherein the bridge is located on the insulating pattern.

7. The flexible touch substrate according to claim 1, wherein the flexible touch substrate further comprises an insulating pattern on the bridge, and wherein the first touch electrodes are located on the insulating pattern.

8. The flexible touch substrate according to claim 1, wherein the flexible touch substrate further comprises a protective layer disposed on a side of the touch electrode patterns away from the flexible base substrate.

9. The flexible touch substrate according to claim 8, wherein the flexible touch substrate further comprises a protective film disposed on a side of the protective layer away from the touch electrode patterns.

10. A touch display device comprising the flexible touch substrate according to claim 1.

11. A method for fabricating a flexible touch substrate, the method comprising:
    forming touch electrode patterns on a first surface of a flexible base substrate, wherein the touch electrode patterns comprise plural columns of first touch electrodes and plural rows of second touch electrodes, wherein the second touch electrodes and the first touch electrodes intersect and are insulated from each other, wherein the second touch electrodes comprise plural second sub-touch electrodes and a bridge, wherein the second sub-touch electrodes are spaced apart from one another by the first touch electrodes, wherein the bridge connects the second sub-touch electrodes adjacent in a row direction and is insulated from the first touch electrodes; and
    forming at least one groove at least on a second surface opposite the first surface of the flexible base substrate, wherein a projection of the groove on the base substrate is within a projection of a gap between the touch electrode patterns on the base substrate, and wherein the groove is located at a position of the base substrate that does not overlap with the bridge in a direction perpendicular to the first surface.

12. The method according to claim 11, wherein after forming the groove on the flexible base substrate, the method further comprises:
    forming an insulating film on the touch electrode patterns;
    patterning the insulating film to form an insulating pattern between the second sub-touch electrodes adjacent in the row direction and covering the first touch electrodes;
    forming a conductive film on the insulating pattern; and
    patterning the conductive film to form the bridge connecting the second sub-touch electrodes adjacent in the row direction.

13. The method according to claim 12, wherein after forming the touch electrode patterns, the insulating pattern, and the bridge, the method further comprises forming a protective layer.

14. The method according to claim 13, wherein after the forming the protective layer, the method further comprises attaching a protective film on the protective layer.

15. The method according to claim 11, wherein before forming the touch electrode patterns on the flexible base substrate, the method further comprises:
  forming a conductive film;
  patterning the conductive film to form the bridge for connecting the second sub-touch electrodes, to be formed, adjacent in the row direction;
  forming an insulating film on the bridge; and
  patterning the insulating film to form an insulating pattern.

16. The method according to claim 15, wherein after forming the touch electrode patterns, the insulating pattern, and the bridge, the method further comprises forming a protective layer.

* * * * *